United States Patent [19]

Leipold

[11] Patent Number: 5,740,071
[45] Date of Patent: Apr. 14, 1998

[54] METHOD AND APPARATUS FOR SELECTIVE SHAPE ADJUSTMENT OF HIERARCHICAL DESIGNS

[75] Inventor: William Charles Leipold, Essex Junction, Vt.

[73] Assignee: International Business Machines Corporation, Armonk, N.Y.

[21] Appl. No.: 487,814

[22] Filed: Jun. 7, 1995

[51] Int. Cl.⁶ .................................................. G06F 17/50
[52] U.S. Cl. ........................ 364/490; 364/489; 364/488
[58] Field of Search ................................ 364/488, 489, 364/490, 491, 578; 395/500

[56] References Cited

U.S. PATENT DOCUMENTS

| | | | |
|---|---|---|---|
| 5,111,413 | 5/1992 | Lazansky et al. | 364/488 |
| 5,164,911 | 11/1992 | Juran et al. | 364/578 |
| 5,187,784 | 2/1993 | Rowson | 395/500 |
| 5,200,908 | 4/1993 | Date et al. | 364/491 |
| 5,212,650 | 5/1993 | Hooper et al. | 364/489 |
| 5,231,590 | 7/1993 | Kumar et al. | 364/491 |
| 5,239,465 | 8/1993 | Hattori et al. | 364/419.19 |
| 5,249,133 | 9/1993 | Batra | 364/489 |
| 5,406,497 | 4/1995 | Altheimer et al. | 364/489 |
| 5,440,720 | 8/1995 | Baisuck et al. | 395/500 |

*Primary Examiner*—Vincent N. Trans
*Attorney, Agent, or Firm*—George E. Clark; Jenkens & Gilchrist; Mark F. Chadurjian

[57] ABSTRACT

A schematic modifier editor that works in concert with a shapes modifier editor so that changes to a design layout are reflected in the schematic. The shapes modifier editor tracks the changes made to the cell hierarchy and saves the changes to a list file. The schematic modifier editor processes the list file and edits the schematic file so that its cell hierarchy corresponds with that of the modified shapes file. The modified schematic file and modified shapes file can then be compared by a conventional verification program to ensure that the modified shapes file implements the desired circuit.

16 Claims, 7 Drawing Sheets

METHOD AND APPARATUS FOR SELECTIVE SHAPE ADJUSTMENT OF HIERARCHICAL DESIGNS

TECHNICAL FIELD OF THE INVENTION

The present invention relates in general to integrated circuit design and in particular to a method and apparatus for preserving the hierarchical correspondence between a design schematic and a design layout of an integrated circuit.

BACKGROUND OF THE INVENTION

A designer uses a computer program called a schematic editor to design integrated semiconductor circuits. The resulting design is saved in a data file called a schematic file. Then, the schematic file is processed by a shapes editor program to generate a data file called a shapes file. The shapes file is used to create a photolithographic mask, which, in turn, is used to create an actual integrated circuit semiconductor chip.

A designer uses the schematic editor to select cells and make connections between them. Cells are logical circuits and can be as simple as an AND gate or as complex as a processor. As represented by the schematic editor, cells have a structure and function, but no physical shape.

Cells are selected from a library of possible cell types. The cell library is represented by the schematic editor as objects in a hierarchy. Each type of cell is a different object. In addition, most cells are actually composed of other cells. This representation is used because a schematic file will typically contain many instances of the same cell. All instances of the same cell in the schematic need only derive from a single cell definition.

The schematic editor saves a netlist describing the cells and connections between them to the schematic file. The designer then processes the schematic file with the shapes editor. The shapes editor analyzes the schematic file and produces a shapes file containing information pertaining to the physical layout of the cells. The shapes editor performs this task by replacing each schematic cell with a layout cell containing shapes which implement the circuit from a shapes library. The shapes library is hierarchically arranged like the schematic editor library. The shapes editor saves the new information in a shapes file.

Next, a sub-program of the shapes editor, the shapes modifier editor, processes the shapes file. Examples of popular shapes modifier editors include Cadence's "Dracula" and an ISS' "VeriCheck". The purpose of the shapes modifier editor is to selectively modify cell shapes to account for limitations in the printing and etching processes. For example, the shape of the cells may need to be altered for proximity correction or for NFET-PFET channel length offset. The shapes modifier editor saves the modified information in a modified shapes file.

The shape modifications made by the shapes modifier editor often destroy the hierarchical nature of the circuit design. This destruction, or flattening, occurs because different instances of the same cell are frequently modified in different ways. When modifying a shape, the shapes modifier editor must first check for other instances of the cell that contains the shape. If other instances exist, the shapes modifier editor must place the modified cell at a higher level in the design hierarchy so that it does not affect other instances of the original cell.

A necessary consequence of the shape modification process is that the hierarchy of the modified shapes file no longer corresponds to the hierarchy of the schematic file. The modified shapes file contains layout cells that have no corresponding schematic cells. Because the files no longer correspond, the modified shapes file cannot be easily checked to ensure that it implements the desired circuit.

If the entire schematic is very small, the modified shapes file can be manually compared with the schematic file. However, this technique is rarely practical. Instead, automated verification methods must be used. One prior art method of automatically verifying the modified shapes file is to check the shapes file before running the shapes modifier editor and trusting that the shapes modifier editor will not make harmful changes to the design. Another method of verification is to test the modified shapes file for errors such as short or open circuits. Obviously, these methods are not desirable because they do not allow direct comparison of the modified shapes file with the schematic file.

SUMMARY OF THE INVENTION

It is an object of the present invention to provide a method and apparatus for design verification of a desired circuit.

It is another object of the present invention to provide a method and apparatus wherein a modified shapes file can be compared with a schematic file using a conventional automatic verification program.

The above and other objects of the invention are met by a schematic modifier editor that works in concert with the shapes modifier editor so that changes to the design layout are reflected in the schematic. The shapes modifier editor tracks the changes made to the shapes hierarchy and saves the changes to a list file. A schematic modifier editor processes the list file and edits the schematic file so that its cell hierarchy corresponds with that of the modified shapes file. The modified schematic file and modified shapes file can then be compared by a conventional verification program to ensure that the modified shapes file implements the desired circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
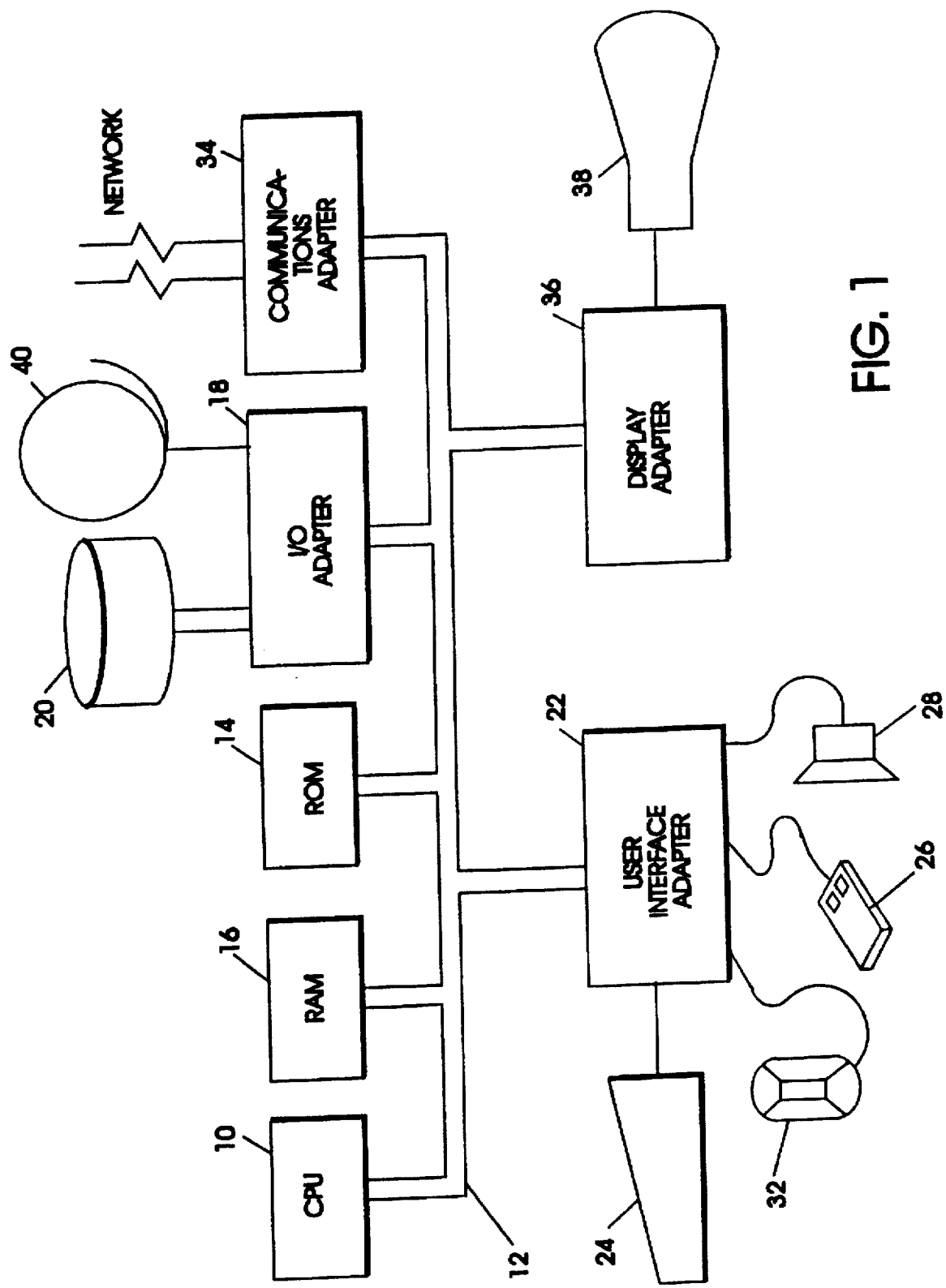
FIG. 1 is a data processing system implementing the present invention.

A representative hardware environment for practicing the present invention is depicted in FIG. 1, which illustrates a typical hardware configuration of a workstation in accordance with the present invention having at least one central processing unit 10, such as a conventional microprocessor, and a number of other units interconnected via system bus 12. The workstation shown in FIG. 1 includes random access memory ("RAM") 14, read only memory 16, and input/output adapter 18 for connecting peripheral devices such as disk units 20 and tape drives 40 to bus 12, user interface adapter 22 for connecting keyboard 24, mouse 26, speaker 28, microphone 32, and/or other user interface devices such as a touch screen device (not shown) to bus 12, communication adapter 34 for connecting the workstation to a data processing network, and display adapter 36 for connecting bus 12 to display device 38.

Figure 2:
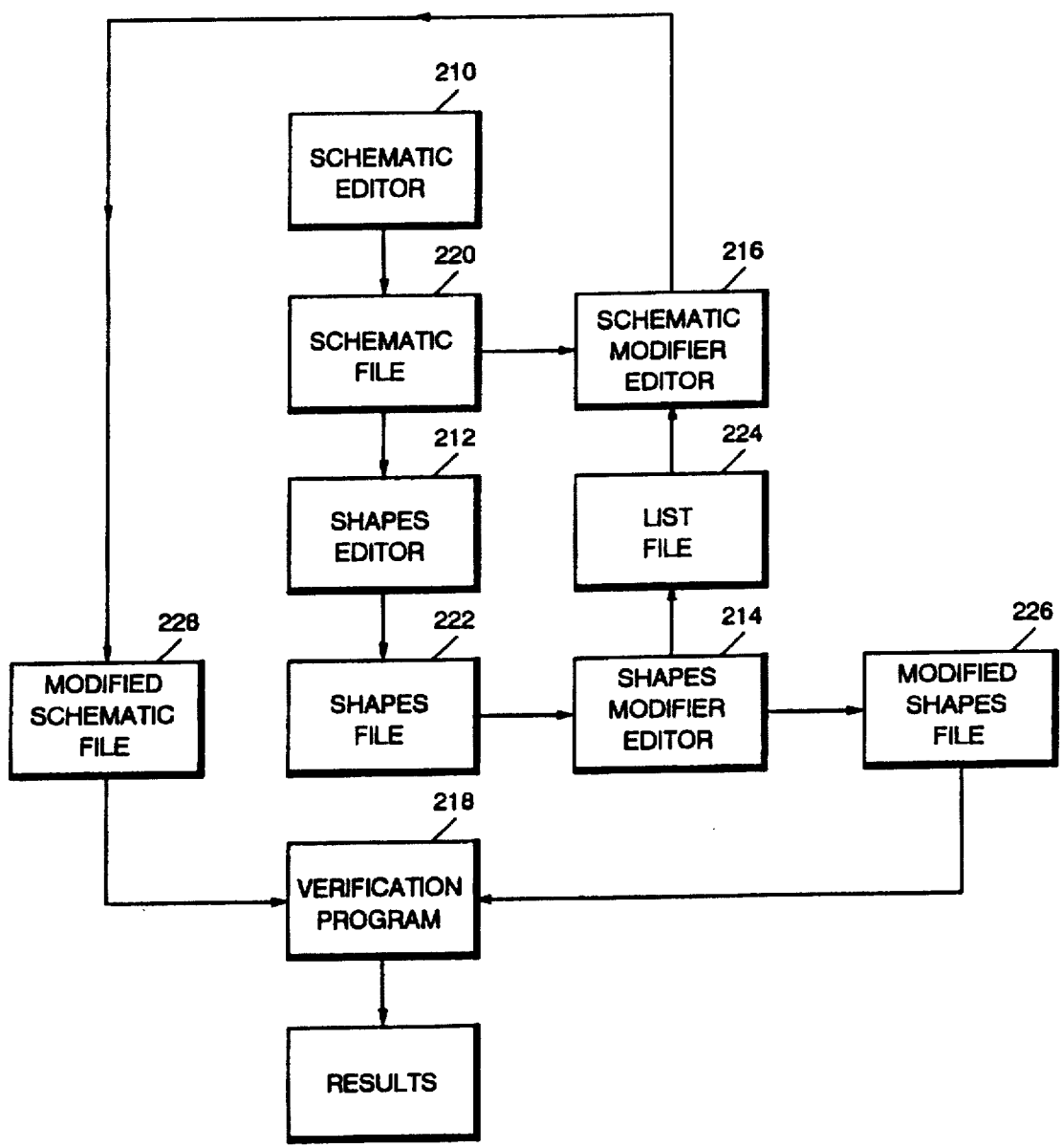
FIG. 2 depicts an overview of the components used to design integrated circuit semiconductors in accordance with the present invention.

FIG. 2 depicts an overview of the method used to design and fabricate semiconductor integrated circuits in accordance with the present invention. Among the program components shown are schematic editor ("SCE") 210, shapes editor ("SHE") 212, shapes modifier editor ("SHME") 214, schematic modifier editor ("SCME") 216 and verification program 218. Also shown are schematic file 220, shapes file 222, list file 224, modified shapes file 226 and modified schematic file 228. The editing programs 210–218 are executed by central processing unit 10 and stored, along with the data files 220–228, in RAM 14 and on peripheral units such as disk unit 20.

SCE 210 is used by a designer to design a semiconductor circuit. Typically, the designer uses keyboard 24 and mouse 26 in combination with display device 38 to define connections between cells and thereby define a circuit. Cells can be chosen from a library of such cells previously created by a designer. Many types of cell libraries are commercially available. An example of such a cell library is the CMOS 5L cell library available from IBM.

Figure 3:
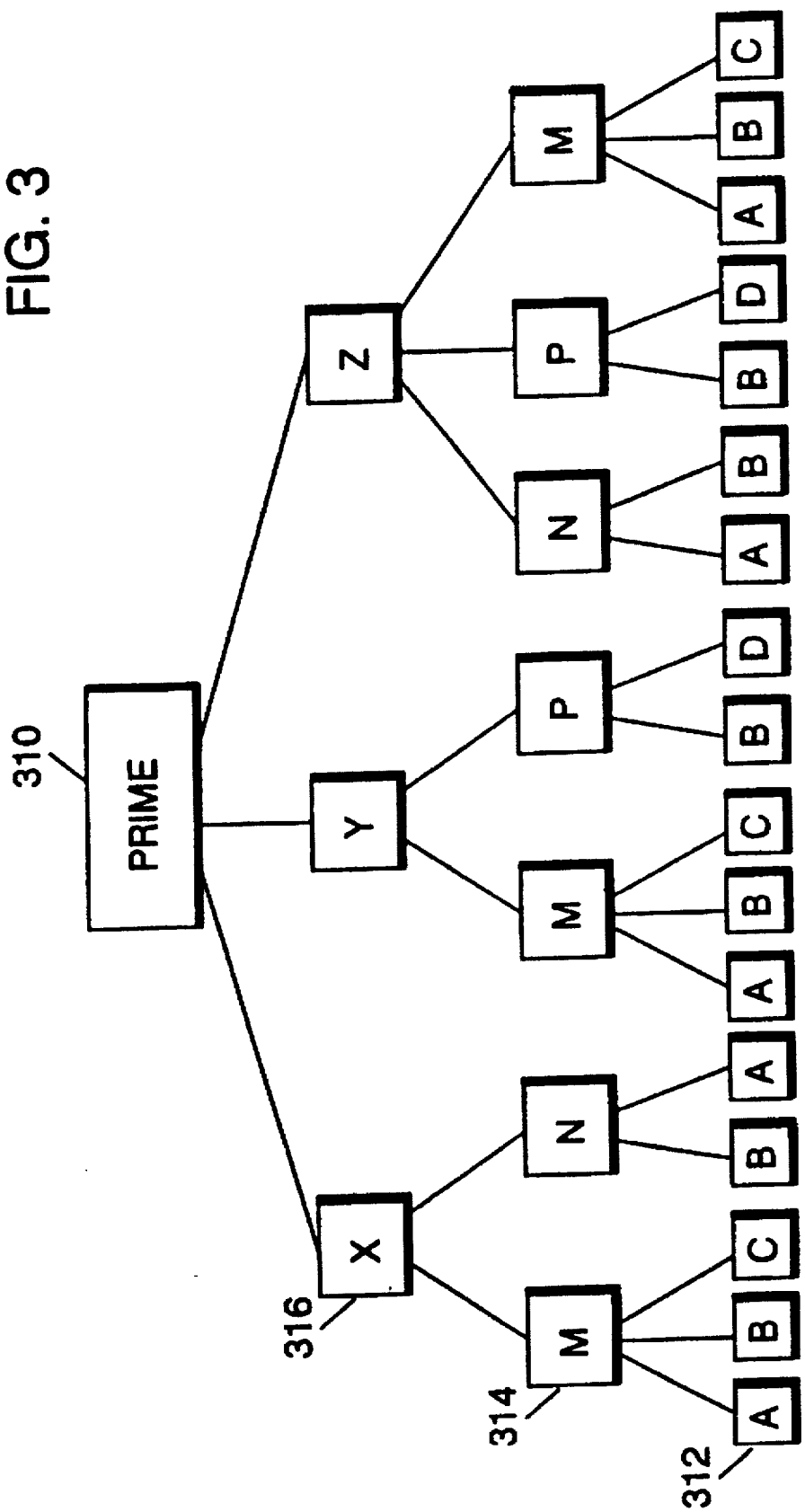
FIG. 3 (Prior Art) is an example of a design object hierarchy utilized in the present invention.

The schematic file 220 stores cells in a cell hierarchy. For example, FIG. 3 depicts a typical cell hierarchy of the prior art. Cell 310 is a comprised of three lower level cells: X, Y and Z. Cells X, Y and Z, in turn, are comprised of combinations of cells M, N and P. Finally, cells M, N and P are comprised of combinations of cells A, B, C and D. Moreover, each instance of a cell is exactly the same. Thus, instances of M cells are always comprised of A, B and C cells. For example, cell A could be an AND circuit, Cell B a FILL circuit (spare shapes to maintain consistent density of shapes across the ASIC), and Cell C a MUX circuit, which combine to form in Cell M a kernel (i.e., subcombination) circuit, and which in turn combines with Cell N (another kernel circuit) to form an adder circuit X.

SCE 210 saves a netlist embodying the designed circuit in schematic file 220. The netlist contains information identifying the cells and connections between them. Schematic file 220 also contains the cell hierarchy.

SHE 212 reads schematic file 220 and determines optimal placement for each cell in the netlist. Each cell in the library consists of one or more shapes that form circuit elements like capacitors or transistors. SHE 212 maps each cell in the netlist to the shapes in the corresponding cell in the layout and determines an arrangement that will accommodate the shapes and connections for the semiconductor circuit. This layout is saved to shapes file 222.

Figure 4:
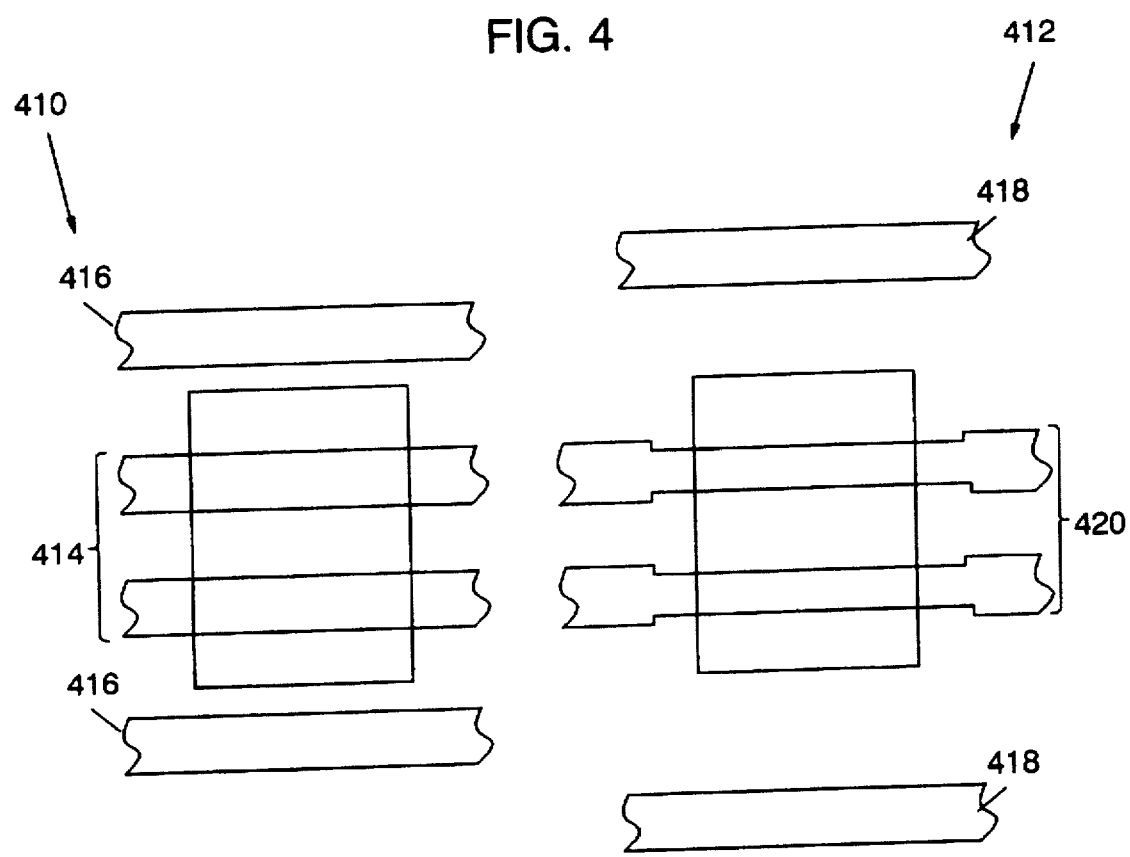
FIG. 4 (Prior Art) is an example of selectively modified shapes.

A sub-program of SHE 212 is SHME 214. SHME 214 analyzes shapes file 222 and determines which shapes must be modified. In general, shapes are selectively modified when necessary to accommodate the behavior of the process (i.e., the process groundrules) used to manufacture the semiconductor integrated circuit. FIG. 4, shows an example in the prior art of an unmodified cell A 410 and a cell A__1 412 that has been selectively modified. Unmodified cell A 410 contains two gates 414 located next to two neighboring polysilicon lines 416. Regarding modified cell A__1 412, the polysilicon lines 418 are farther from the gates 420. As a result, the shape of gates 420 has been modified to account for pattern density effects in etching.

Figure 5:
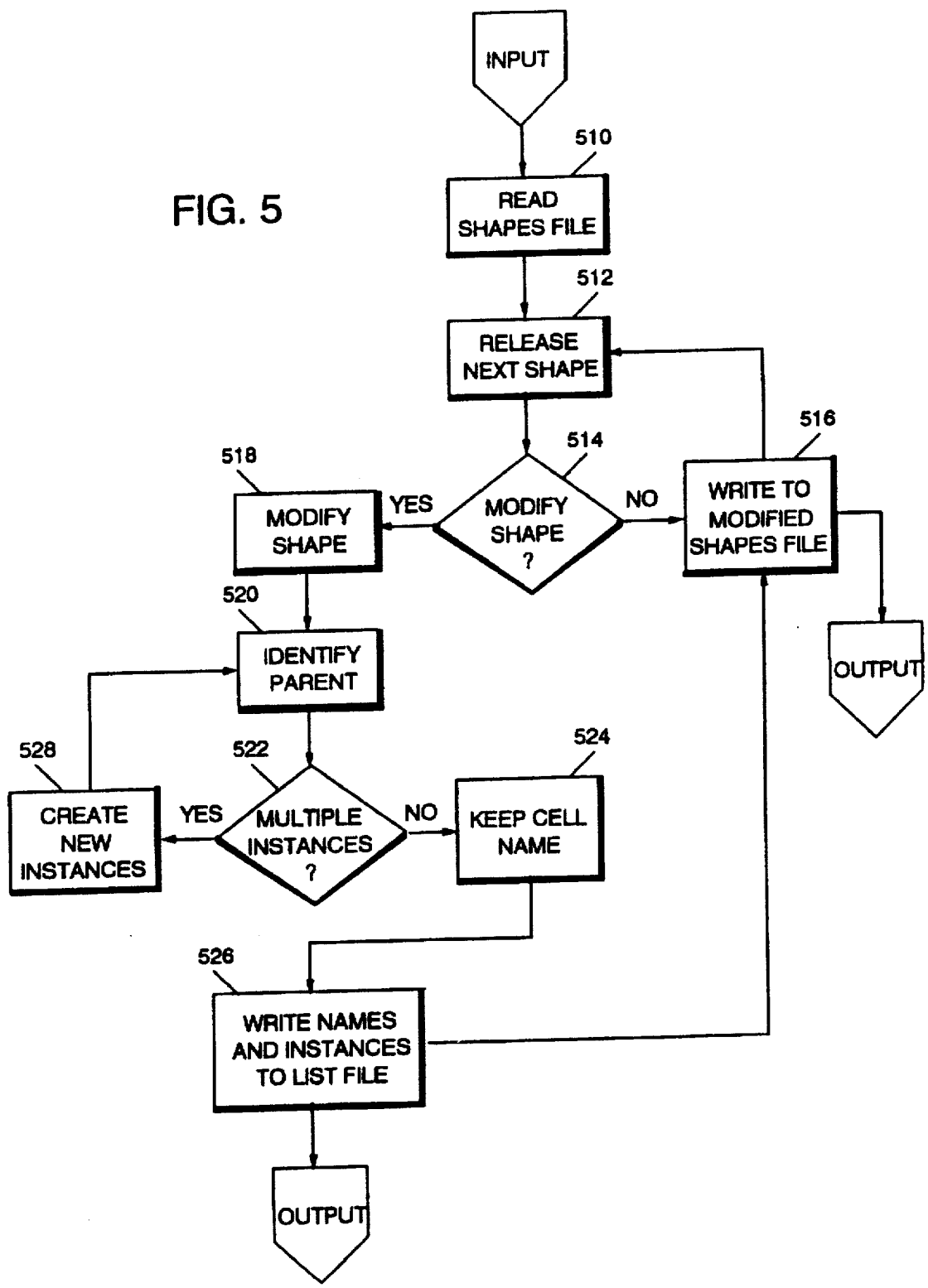
FIG. 5 is a flow chart showing the operation of a shape modifier editor in accordance with the present invention.

The behavior of SHME 214 is shown in the flow chart depicted in FIG. 5. At step 510, SHME 214 reads shapes file 222 containing the cell hierarchy and, at step 512, releases a shape into its processing logic. At step 514, SHME 214 determines whether the shape must be modified. If no modification is necessary, the shape is written directly to modified shapes file 226 (step 516). Then, SHME 214 returns to step 512.

At step 518, SHME 214 modifies the shape. Next, SHME 214 identifies the cell having the modified shape (step 520). At step 522, SHME 214 determines whether there are multiple occurrences of the modified cell (i.e., cell A__1 412). If there is only one occurrence of the modified cell, SHME 214 keeps the same cell name to represent that cell (step 524), writes the name and occurrence of the cell to list file 224 (step 526), writes the cell containing the modified shape to modified shapes file 226 (step 516) and then returns to step 512 and processes the next shape in shapes file 222. If there are multiple occurrences of the modified cell, SHME 214 creates new instances of the cell (step 528), then repeats this step as it recursively travels up the hierarchy until it finds a cell with only one occurrence. Then, SHME 214 writes the names and instances to list file 224 (step 526) writes to the modified shapes file (step 516) and then returns to step 512 to process the next shape in shapes file 222.

Note that SHME 214 outputs two files: list file 224 and modified shapes file 226. List file 224 contains the names and instances of the modified cells. Modified shapes file 226, in contrast, is a complete shapes file containing all layout data necessary to create a semiconductor circuit.

Figure 6:
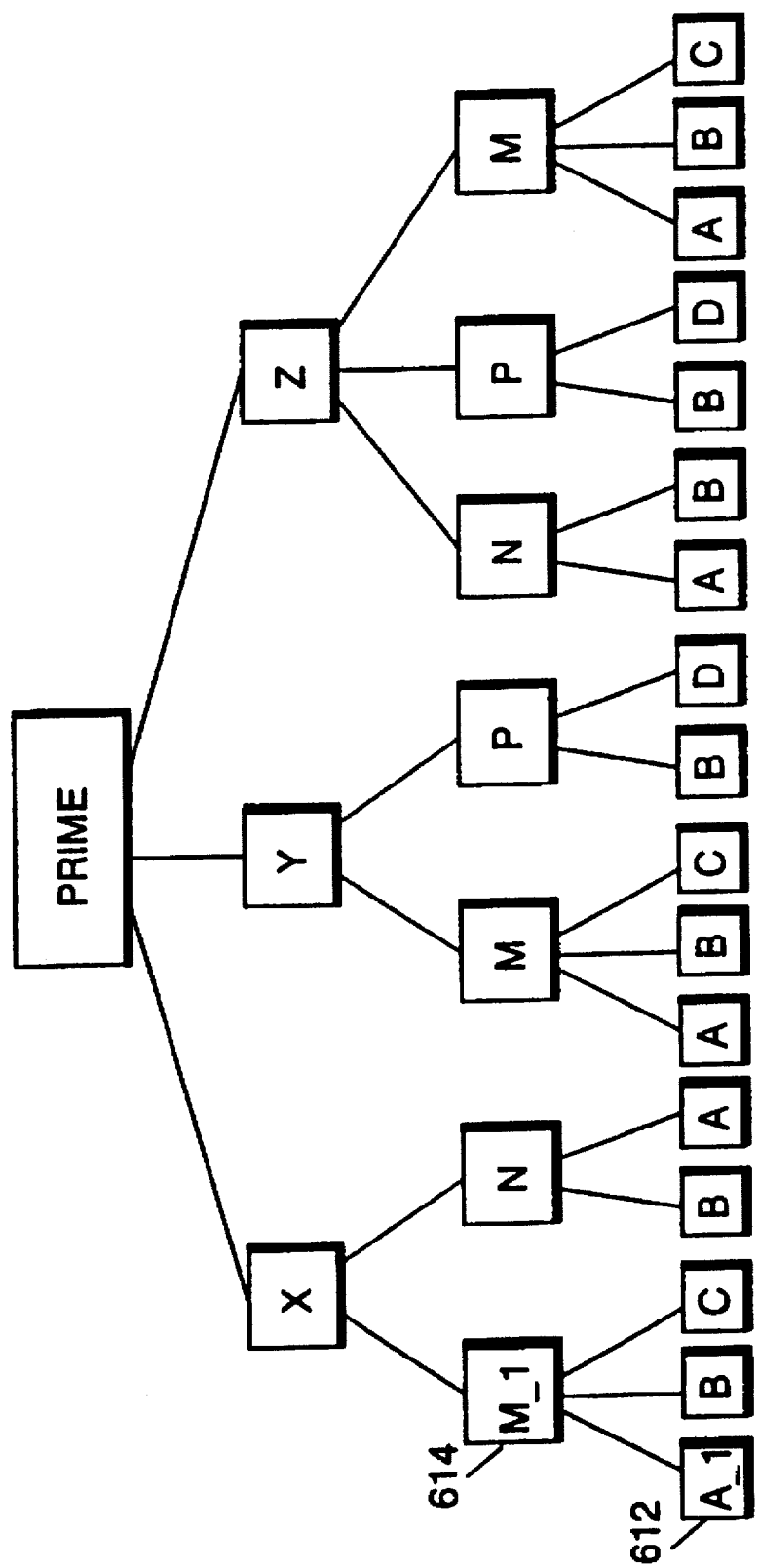
FIG. 6 is an example of a modified object hierarchy in accordance with the present invention.

The behavior of SME 214 can best be explained by considering FIGS. 3 and 6. Assume cell M 364 contains cell A 312. A shape in cell A 312 must be modified. There are multiple instances of cells A and M.

The hierarchy resulting from the modifications made by SHME 214 can be seen in FIG. 6. Cell A__1 612 is a modified version of cell A 312. In addition, Cell M__1 614 is a modified version of cell M 314. By following this procedure, SHME 214 can modify shapes without disrupting the cell hierarchy.

Figure 7:
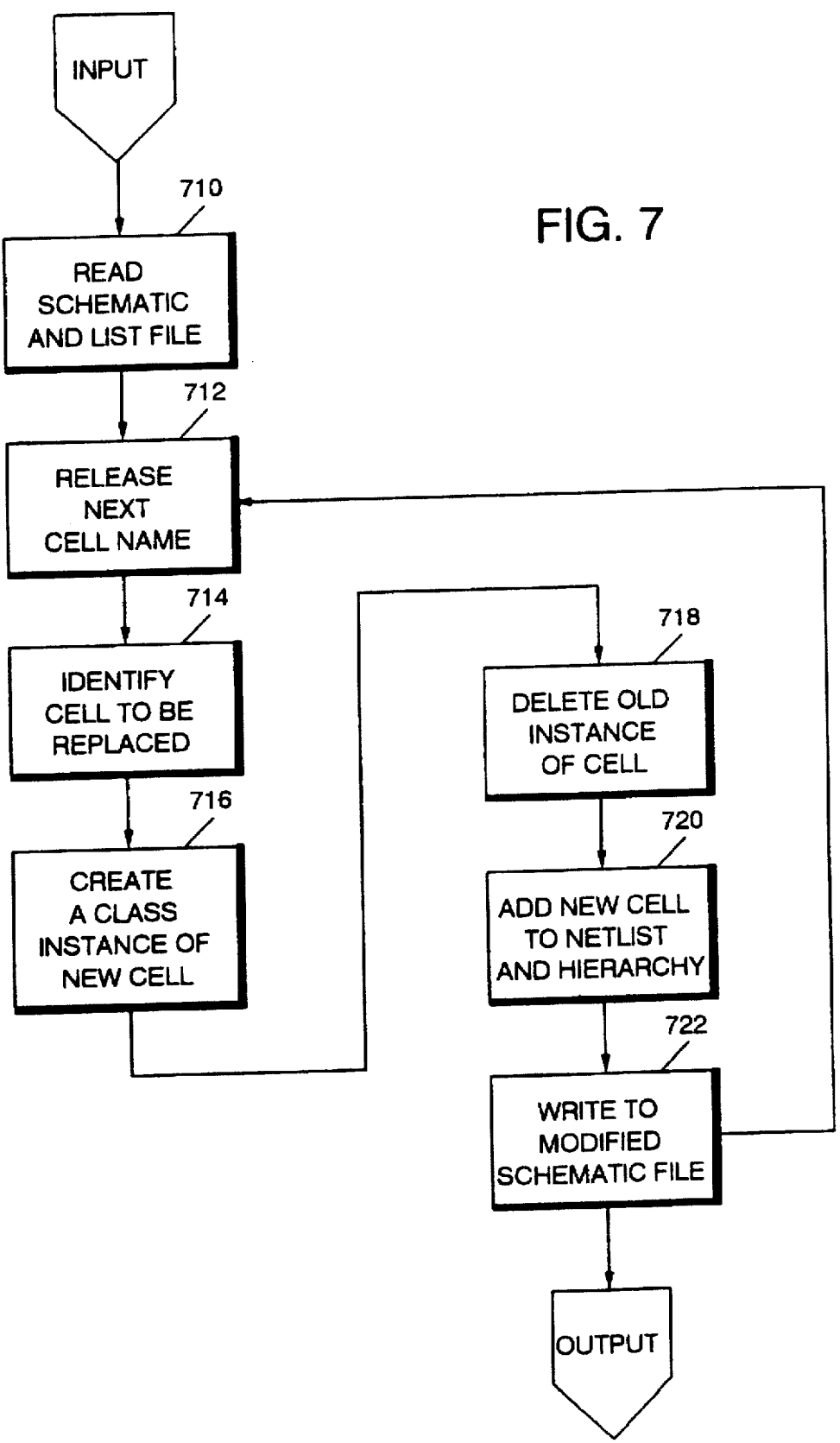
FIG. 7 is a flow chart showing the operation of a schematic modifier editor in accordance with the present invention.

SCME 216 reads list file 224 and modifies the hierarchy of schematic file 220 to correspond with that of modified shapes file 226. FIG. 7 is a flow chart depicting the steps performed by SCME 216. At step 710, SCME 216 reads schematic file 220 and list file 224. Next, at step 712, the name of a modified cell from list file 224 is released to the SCME 216 processing logic. At step 714, SCME 216 identifies the exact cell in schematic file 220's netlist to which the name refers. At step 716, SCME 216 creates a new cell corresponding to the modified cell. Next, at step 718, SCME 216 deletes the old instance of the cell from the netlist and cell hierarchy, respectively. At step 720, SCME 216 adds the new cell to the netlist and hierarchy. Finally, at step 722, SCME 216 writes the modified information to modified schematic file 228. At this point, SCME 216 returns to step 710 until all of the names in list file 224 have been processed. As a result, both the modified schematic file 228 and the modified shapes file 226 have the same hierarchy (e.g., the hierarchy shown in FIG. 6).

Verification program 218 verifies that modified shapes file 226 implements the circuit described by modified schematic file 228. The operation of verification programs is well understood in the prior art and need not be discussed here. However, it is important to note that this verification is only possible because SCME 216 has modified the schematic file to correspond with modified shapes file 226, such that the hierarchy is consistent between the schematic file and shapes file as compared by the verification program 218. Without use of the invention, the schematic file would have the hierarchy of FIG. 3, and the shapes file would have the hierarchy of FIG. 6. The modified shapes file 270, as verified by program 218, is then used at step 280 to generate the photomasks embodying the desired shapes using conventional techniques. The masks in turn are used in a conventional semiconductor manufacturing process 290 to produce product chips 300.

Although the present invention and its advantages have been described in detail, it should be understood that various changes, substitutions and alterations can be made herein without departing from the spirit and scope of the invention as defined by the appended claims. For example, although the invention has been described in the context of cells having logic gates, the cells could be of any circuit "building blocks", such as buffers or receivers used to build up RAM macros.

What is claimed is:

1. A data processing system, comprising:
    a memory for storing a schematic file and shapes file, each of said schematic file and shapes file containing a first cell hierarchy; and
    adjusting means for selectively adjusting said shapes file so that said shapes file has a second cell hierarcy different from said first cell hierarchy, and for selectively adjusting said schematic file to have said second cell hierarchy.

2. The data processing system of claim 1, further comprising:
    schematic editing means for selecting cells from a cell hierarchy and defining connections between said cells.

3. The data processing system of claim 1, further comprising:
    shape editing means for selecting shapes from said shapes file.

4. The data processing system of claim 1, wherein said adjusting means further comprises:
    shapes modifying means for selectively modifying at least one shape from said shapes file to produce a modified shape file containing the second cell hierarchy; and
    schematic modifying means for selectively modifying a cell corresponding to said at least one shape in the schematic file to correspond with said modified one of said shapes from said shapes file, and modifying said cell hierarchy in the schematic file to correspond with said modified cell hierarchy in the modified shapes file thereby producing a modified schematic file.

5. The data processing system of claim 1, further comprising:
    verification means for verifying that a circuit represented by the modified shapes file implements the circuit represented by the modified schematic file.

6. A data processing system, comprising:
    schematic editing means for selecting cells from a first cell hierarchy, defining connections between said cells and saving said cells and connections to a schematic file;
    shapes editing means for selecting shapes from said first cell hierarchy and saving said shapes to a shapes file, said shapes file corresponding to said schematic file; and
    adjusting means for selectively adjusting said shapes contained in said shapes file and maintaining correspondence between said hierarachies of said cell and shapes files.

7. The data processing system of claim 6, wherein said adjusting means further comprises:
    shapes modifying means for selectively modifying said shapes contained in said shapes file;
    schematic modifying means for modifying said schematic file to correspond with said modified shapes file.

8. The data processing system of claim 7, further comprising:
    means for creating a list file created by said shapes modifying means, said list file containing information regarding said modified shapes and used by said schematic modifying means to modify said schematic file.

9. The data processing system of claim 6, further comprising:
    verification means for verifying that said circuit represented by the modified shapes file implements the circuit represented by the modified schematic file.

10. A method of manufacturing a circuit having a hierarchical design comprising the steps of:
    selecting at least one cell from a schematic file having a given cell hierarchy;
    selecting a corresponding shape from a shapes file having said given cell hierarchy;
    selectively modifying said shape to create a modified shapes file while maintaining correspondence between said hierarchies of said cell and shapes files; and
    generating product chips using photomasks embodying said modified shapes file.

11. The method of claim 10, further comprising the step of, after said step of selecting at least one cell from said cell hierarchy, defining connections to said at least one cell.

12. The method of claim 11, further comprising the step of:
    saving said selected cell and defined connections to a schematic file.

13. The method of claim 10, further comprising the step of, after selectively modifying said shape, saving said modified shape to a modified shapes file.

14. The method of claim 10, wherein said selectively modifying step further comprises the steps of:
    modifying said cell hierarchy of said shapes file to produce a modified cell hierarchy; and modifying said cell hierarchy of said schematics file to correspond with said modified cell hierarchy of said shapes file.

15. The method of claim 14, further comprising the step of:

creating a list file containing information regarding said modified shapes, said list file used by said modifying said cell step to determine which cells have been modified.

16. The method of claim 10 wherein, prior to said step of generating product chips, the method further comprises the step of:

verifying that said circuit represented by the modified shapes file implements the circuit represented by the modified schematic file.

\* \* \* \* \*